(12) United States Patent
Kawaletz et al.

(10) Patent No.: US 11,131,722 B2
(45) Date of Patent: Sep. 28, 2021

(54) APPARATUS AND METHOD FOR CHECKING AND CALIBRATING A COMPONENT

(71) Applicant: TDK—Micronas GmbH, Freiburg (DE)

(72) Inventors: Oliver Kawaletz, Eichstetten (DE); Martin Cornils, Freiburg (DE)

(73) Assignee: Micronas GmbH, Freiburg (DE)

(*) Notice: Subject to any disclaimer, the term of this patent is extended or adjusted under 35 U.S.C. 154(b) by 39 days.

(21) Appl. No.: 16/718,787

(22) Filed: Dec. 18, 2019

(65) Prior Publication Data

US 2020/0200836 A1    Jun. 25, 2020

(30) Foreign Application Priority Data

Dec. 19, 2018   (DE) .................... 10 2018 132 940.7

(51) Int. Cl.
*G01R 33/31*   (2006.01)
*G01R 33/00*   (2006.01)

(52) U.S. Cl.
CPC ..... *G01R 33/0035* (2013.01); *G01R 33/0082* (2013.01); *G01R 33/31* (2013.01)

(58) Field of Classification Search
CPC ............ G01R 33/0035; G01R 33/0082; G01R 33/31; G01R 35/00; G01R 33/12; G01R 31/26; G01R 33/00; G01R 33/0023; G01R 33/0017; G01R 31/3191; G01B 7/004; G01C 17/38; G06F 3/017; G06F 3/0346; G06F 3/012
See application file for complete search history.

(56) References Cited

U.S. PATENT DOCUMENTS

| | | | |
|---|---|---|---|
| 6,191,599 B1* | 2/2001 | Stevens | G01R 31/2862 324/750.07 |
| 7,768,777 B2* | 8/2010 | Miller | G01R 31/2863 361/679.53 |
| 2010/0030881 A1 | 2/2010 | Moreira et al. | |
| 2010/0308812 A1 | 12/2010 | Marbler | |
| 2013/0008628 A1* | 1/2013 | Tiengtum | G01R 1/0458 165/100 |
| 2013/0038321 A1* | 2/2013 | Suzuki | G01R 33/0035 324/224 |

FOREIGN PATENT DOCUMENTS

CN    106871948 A    6/2017

* cited by examiner

*Primary Examiner* — Patrick Assouad
*Assistant Examiner* — Taqi R Nasir
(74) *Attorney, Agent, or Firm* — 24IP Law Group USA, PLLC; Timothy R DeWitt

(57) ABSTRACT

An apparatus (10) for checking a component (30) is disclosed. The apparatus (10) comprises a sample holder (20) with a module (28) for receiving at least one component (30), at least one magnetic field generator (60a, 60b, 60c) for generating a magnetic field around the module (28), an inlet (40) for feeding a tempered medium into the module (25), and an outlet (45) for discharging a tempered medium from the module (28).

20 Claims, 9 Drawing Sheets

APPARATUS AND METHOD FOR CHECKING AND CALIBRATING A COMPONENT

CROSS REFERENCE TO RELATED APPLICATIONS

This application claims benefit to and priority of German Patent Application No. DE 10 2018 132 940.7 filed on Dec. 19, 2018 and entitled "Vorrichtung und Verfahren zur Prüfung und Kalibrierung eines Bauteils", the contents of which are incorporated herein by reference.

BACKGROUND OF THE INVENTION

Field of the Invention

The invention relates to an apparatus for checking a component in a magnetic field and to a method for carrying out the checking of the component in the magnetic field.

Brief Description of the Related Art

Apparatus and methods for checking components are known in the art. For example, the U.S. Published Patent Application No. US 2010/0308812 A1 (Infineon) shows a test system with a carrier for a semiconductor component and a magnetic field generator in the vicinity of the carrier. In the described method, the magnetic field is generated by the magnetic field generator and the effect of the magnetic field on the component is measured.

Other apparatus and methods are known to the inventors. These known apparatus and method show disadvantages, such as imprecise magnetic fields through the use of poorly dimensioned coils as magnetic field generators, instability of the generated magnetic fields through temperature variation of the coils in the magnetic field generators, unreliable electrical contacting of the components, mechanical stress in the components to be measured, and long transient times for magnetic fields and temperature.

SUMMARY OF THE INVENTION

For checking (including characterizing and calibrating) components, such as magnetic field sensors, the components have to be measured electrically under defined environmental parameters. These environmental parameters are, for example, the strength and orientation of the magnetic field, as well as temperature and humidity. Some challenges have to be overcome with respect to this checking. The environmental parameters have to be controlled very precisely, independently of each other, in order to obtain reliable measuring results. A reliable electrical contacting of the component with a measuring device must be enabled over the range of the environmental parameters. Parasitic disturbing influences which can have an impact on the function of the components (for example the aforementioned magnetic field sensors), for example mechanical stresses and/or electromagnetic interference, should be substantially eliminated. The test environment must be robust and should have a high throughput for application in a production facility.

It is therefore the object of the invention to develop an improved apparatus and an improved method for checking a component.

In one aspect of the invention, the apparatus comprises a sample holder with a component-receiving module for receiving at least one component, at least one magnetic field generator for generating a magnetic field about the sample holder, and an inlet for feeding a tempered medium into the component-receiving module, as well as an outlet for discharging a tempered medium from the module. In this apparatus, the magnetic field generator is located outside the region in which the environmental parameters are changed. This separation of sources of the environmental parameters from each other and with respect to the module permits a more rapid change of the environmental parameters at the component, since the magnetic field generator does not need to be heated as well, as was previously the case in the state of the art. Merely the temperature of the smaller component-receiving module has to be changed. The environmental temperature of the magnetic field generator thus remains substantially constant and therefore the magnetic field is stable as well. The relatively small component-receiving module can also be heated and cooled quickly.

The sample holder has at least one inlet opening for guiding the tempered medium from the inlet into a cavity in the module, and at least one outlet opening of the tempered medium from the cavity of the module to the outlet. The component or components are arranged between the inlet opening and the outlet opening in the cavity, so that the component or components are subjected to an incident flow of the tempered medium.

In one aspect of the invention, the sample holder with the module is composed of two parts. The cavity is formed by mutually opposite recesses in the two parts or in one of the two parts. By joining the two parts, the component or components are positioned in the cavity and can be held and electrically contacted reliably.

The magnetic field generator comprises a plurality of coils which are arranged substantially orthogonally to each other. In one aspect, the coils are formed as Helmholtz coils and the generated magnetic field is thus largely homogeneous along the axis of the Helmholtz coils. The component or components are arranged in a largely homogeneous region around the common axes of the coils.

The sample holder has several connecting elements in the cavity for contacting the component or components. These connecting elements are preferably configured as spring contact pins and contact the component or components upon joining the two parts of the sample holder.

The sample holder can also have guiding channels in the module and the cavity, which guide the tempered medium around the component or components.

A control and measuring device for controlling the apparatus with the tempered medium and the magnetic field and for evaluating the measuring data is present as well.

The method for checking the component or components comprises the introduction of a sample holder with at least one component mounted in a module into a magnetic field. Subsequently, an inlet is brought to an inlet opening in the sample holder and an outlet is brought to a discharge opening in the sample holder. Subsequently, the module is subjected to an incident flow of a tempered medium from the inlet to the outlet. As stated above, the tempered medium is guided only through the relatively small module. The environmental parameters can thus be changed more quickly.

BRIEF DESCRIPTION OF THE DRAWINGS

The invention will hereinafter be explained in more detail with reference to the drawings.

DETAILED DESCRIPTION OF THE INVENTION

Figure 1:
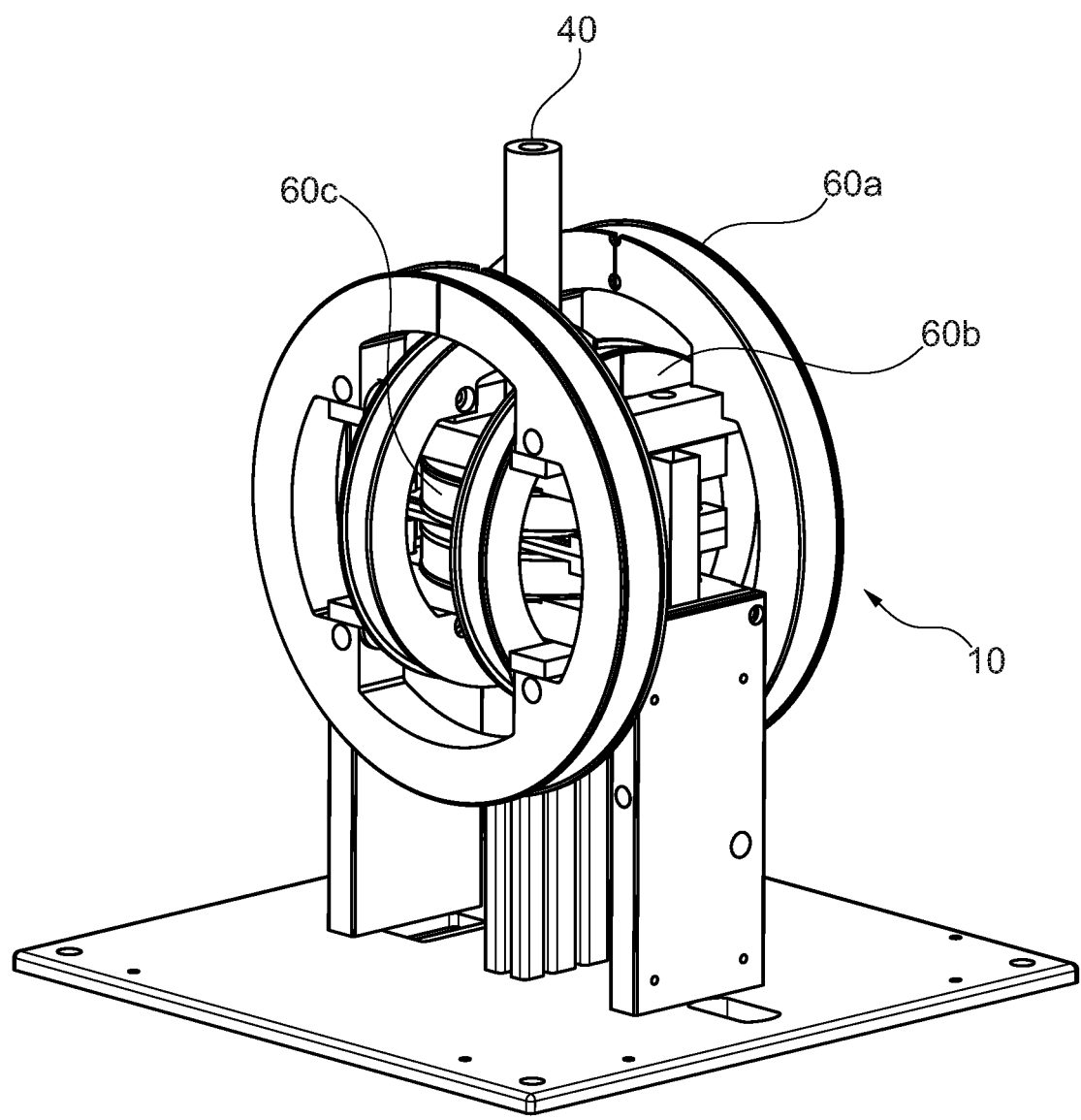
FIG. 1 shows a perspective representation of the apparatus from a first side.
Figure 2:
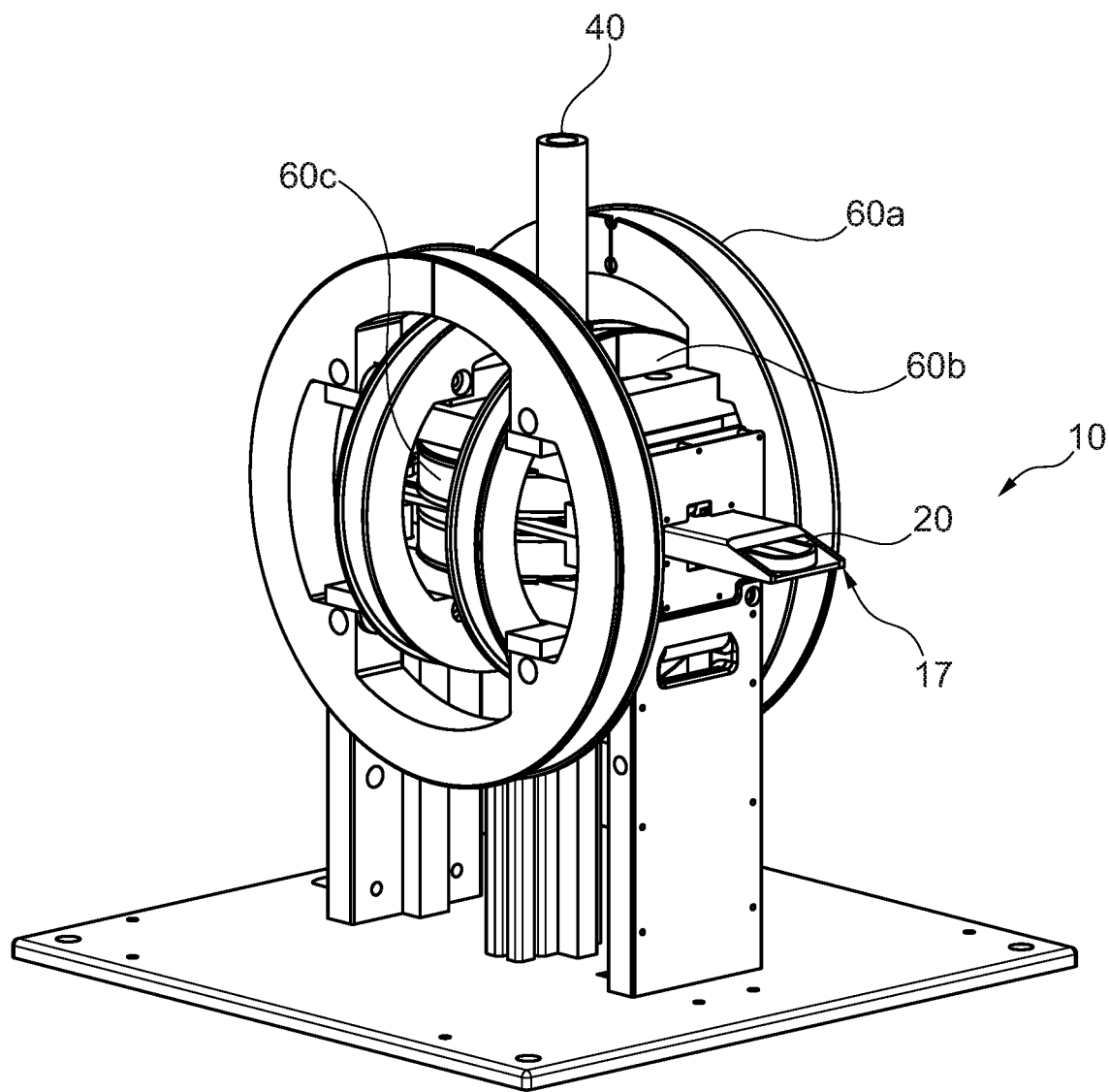
FIG. 2 shows a perspective representation of the apparatus from the other side.
Figure 3A:
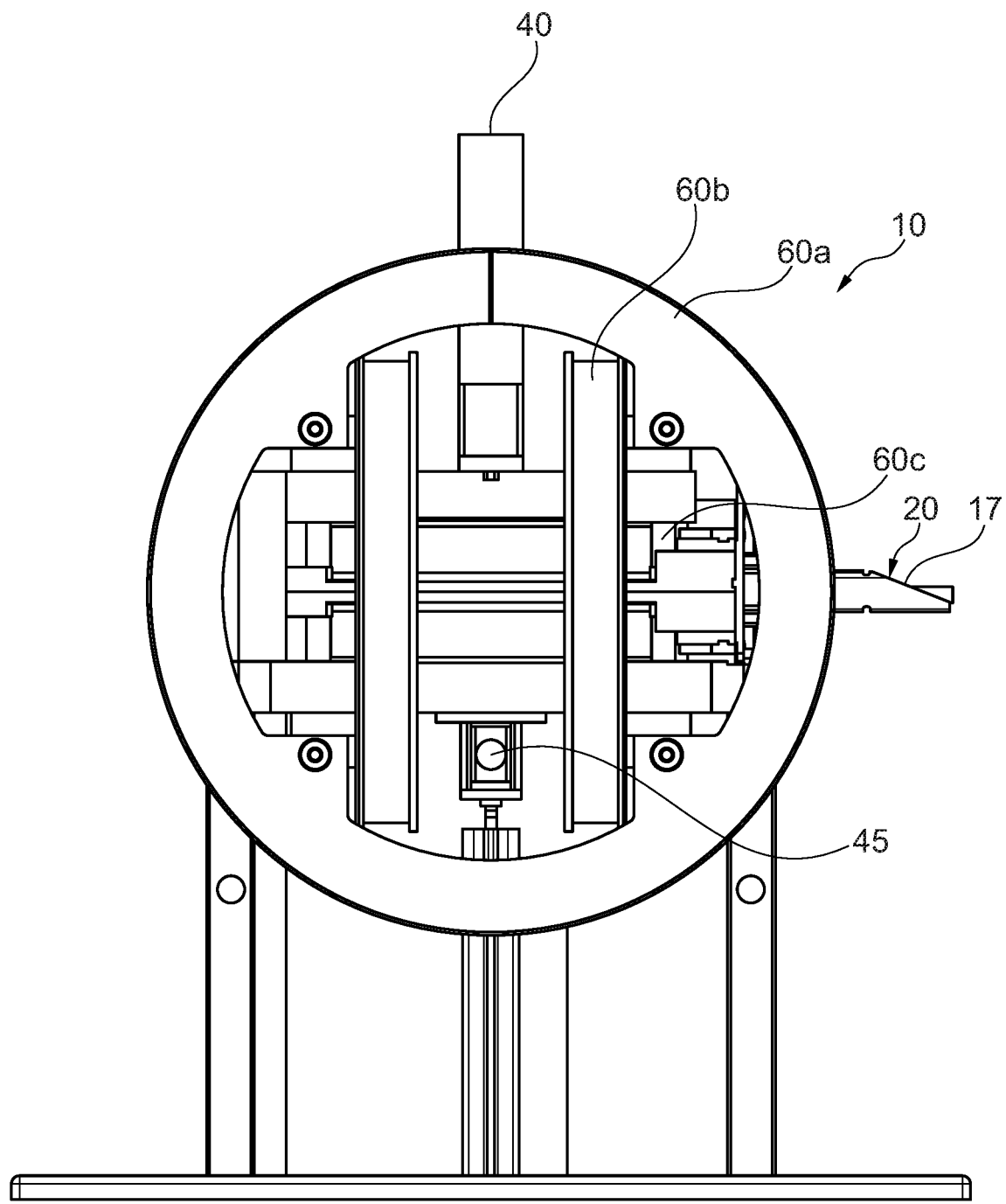
FIG. 3A shows a lateral view of the apparatus.
Figure 3B:
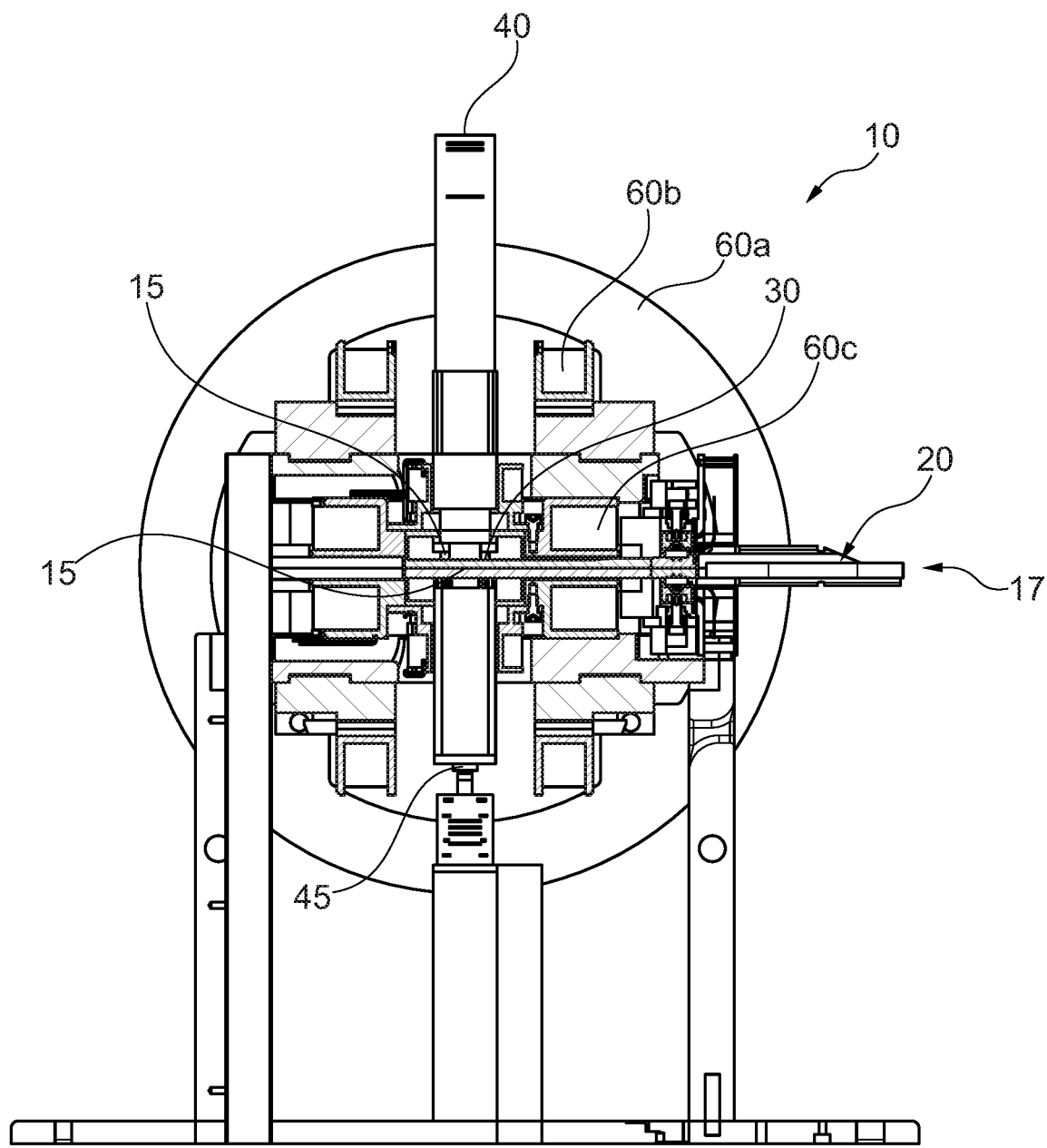
FIG. 3B shows a sectional drawing of the apparatus from the same position as FIG. 3A.

FIGS. 1 and 2 show two perspective representations of an apparatus 10 for checking at least one component 30 received in a sample holder 20. The checking of the at least one component 30 includes, but is not limited to, calibrating the component 30. The FIGS. 3A and 3B show a lateral view of the same apparatus 10, wherein FIG. 3A shows the external appearance of the apparatus 10 and FIG. 3B shows a sectional representation with the interior structure of the apparatus 10. In the FIGS. 1 and 2, the component 30 is not visible, since the component 30 is disposed inside the apparatus 10. The sample holder 20 is represented in more detail in the FIGS. 4, 5A, 5B, 6 and 7 and will be described in more detail below. FIGS. 2 and 3B show the sample holder 20 mounted in the apparatus 10.

The apparatus 10 has a magnetic field generator, which in FIGS. 1 and 2 comprises a total of ten coils arranged in pairs. In the drawings only three pairs of coils 60a, 60b and 60c can be recognized. Two further pairs of coils are arranged inside the magnetic field generator in the same orientation as the pair of coils 60c. Each pair of the coils is in one aspect configured in a type of "Helmholtz" arrangement with a largely homogeneous magnetic field in the vicinity of its coil axis. The pairs of coils 60a, 60b and 60c are arranged orthogonally to each other and their axes have a common intersection 15 (represented in the sectional view of FIG. 3B). The component 30 is attached in the apparatus 10 such that the component 30 is located largely at the or about the intersection 15 where the coil axes of the pairs of coils 60a, 60b and 60c intersect. At this intersection 15 the magnetic field generated by the pairs of coils 60a, 60b and 60c is therefore substantially homogeneous in all directions.

The apparatus 10 has an inlet 40 and an outlet 45 which guide respectively a tempered medium into the apparatus 10 and out of the apparatus 10. The tempered medium is air, for example, at a predetermined temperature and humidity. From FIG. 3B it can be recognized that the inlet 40 feeds the tempered medium to the component 30 and the outlet 45 conducts the tempered medium away from the component 30. The outlet 45 is connected to a disposal apparatus (not shown). The tempered medium could also be a different gas, for example a noble gas.

The sample holder 20 can be guided into and out of the apparatus 10 through a holder opening 17. This guiding in and out can take place automatically or manually. In a further aspect the sample holder 20 forms part of a lead frame with a plurality of components 30, which is pulled through the holder opening 17 in the apparatus 10 in a continuous or semi-continuous process. The lead frame can have, for example, components in dimensions of 8×20 components, wherein this dimension is not limiting of the invention.

The sample holder 20 is represented in FIGS. 4, 5A, 5B, 6 and 7 and comprises a handle 21 for gripping the sample holder 20 during the guiding in and out of the sample holder 20 in the apparatus 10, a body 29 and on the other end of the body 29 a module 28, in which the component 30 is located in a cavity 25.

Figure 4:
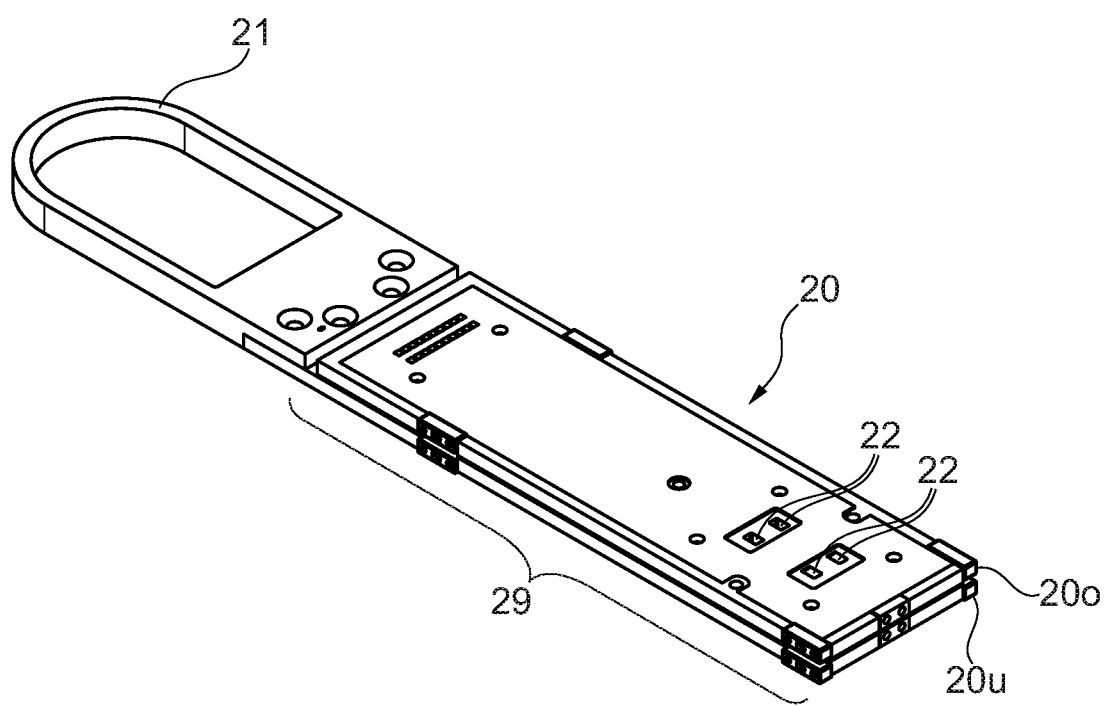
FIG. 4 shows a drawing of a sample holder.
Figure 5A:
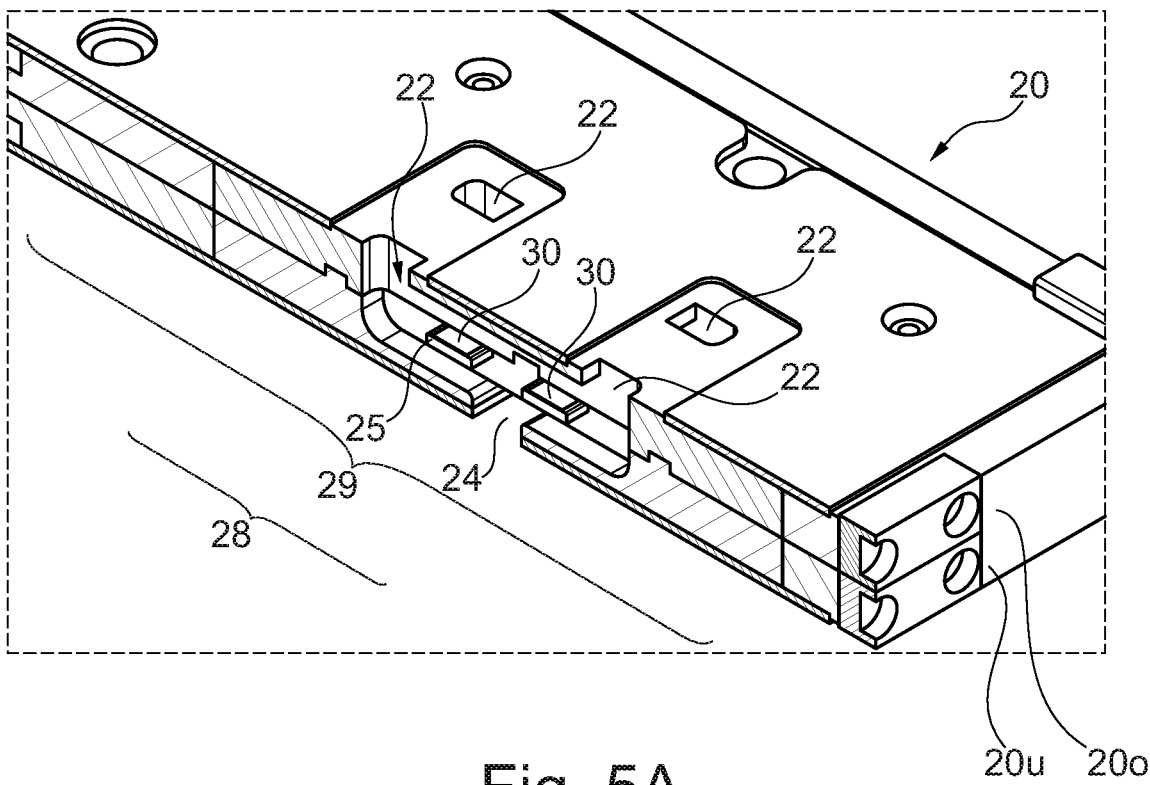
FIGS. 5A and 5B show a sectional drawing of the end of the sample holder.
Figure 5B:
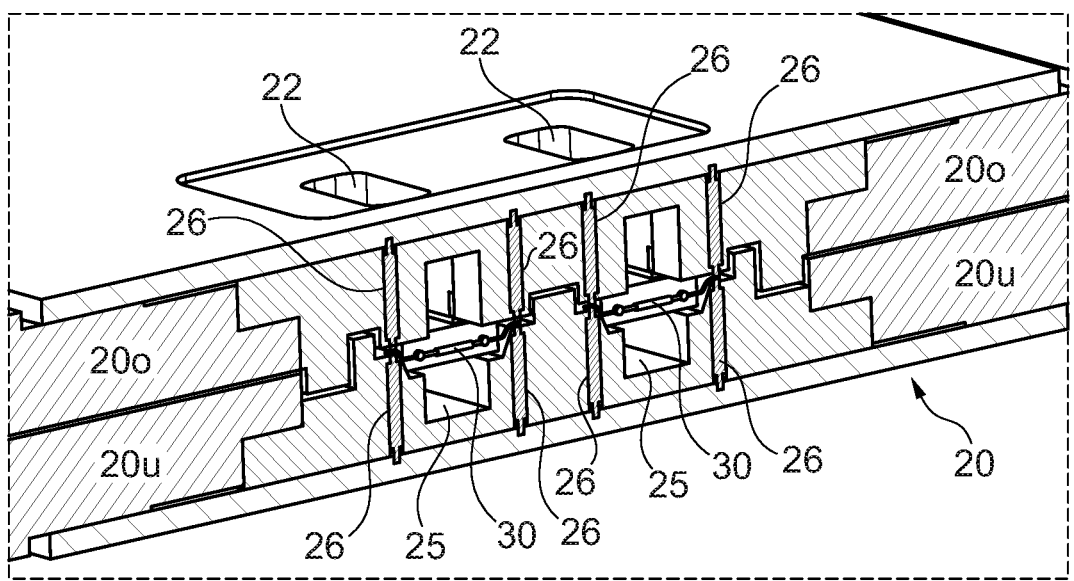
Figure 6:
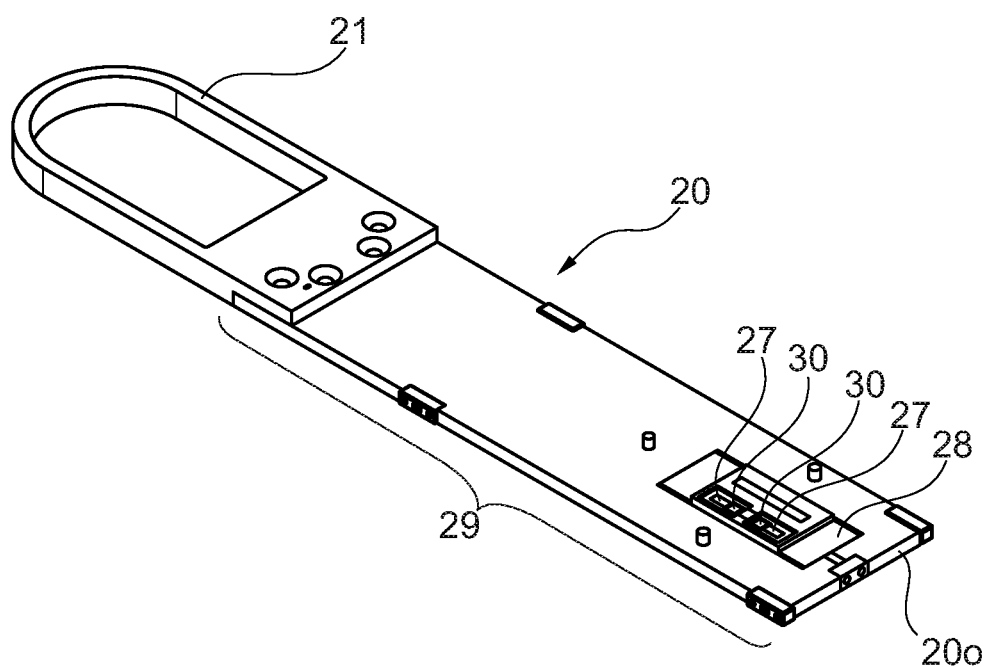
FIG. 6 shows the lower portion of the sample holder.
Figure 7:
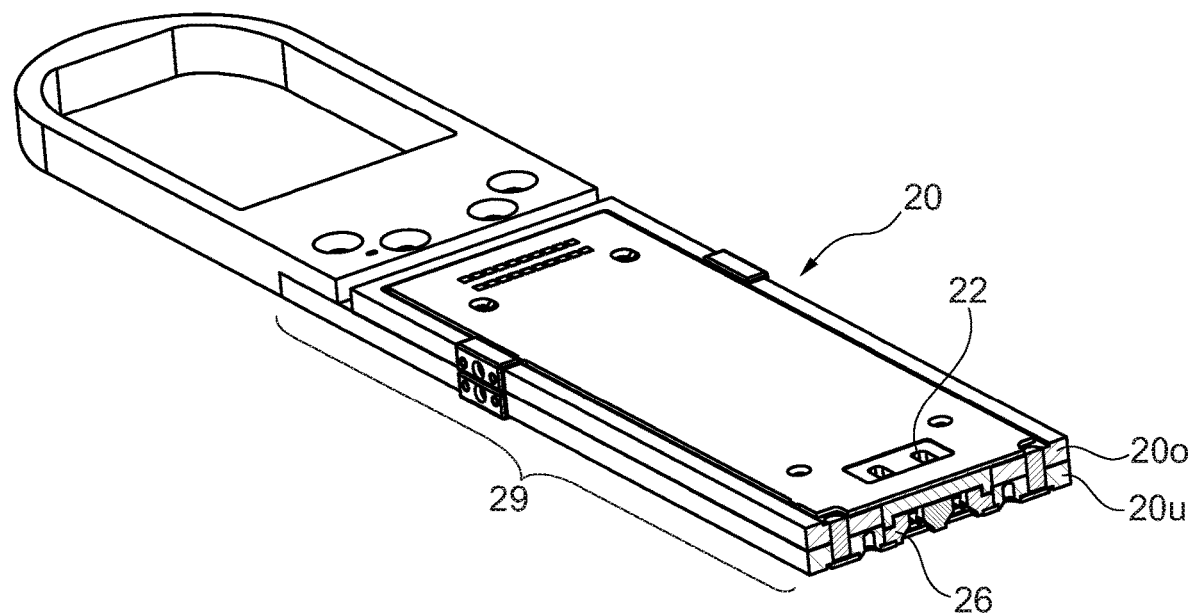
FIG. 7 shows a sectional drawing of the sample holder with electrical connecting elements.

FIG. 4 shows the sample holder 20 with an upper part 20o and a lower part 20u, which are joined. FIGS. 5A and 5B show two representations of a sectional drawing of the lower end of the sample holder 20 with the cavity 25 and thus makes the module 28 with the cavity 25 more easily recognizable. FIG. 6 shows the lower part 20u of the sample holder 20 with the module 28 for the component 30.

At least one inlet opening 22 is incorporated in the upper surface of the body 29. In the FIGS. 4 and 5A, four inlet openings 22 and in FIG. 5B two inlet openings 22 are shown, wherein the number of inlet openings 22 is not limiting of the invention. These inlet openings 22 are arranged in the apparatus 10 in the position 15 such that the inlet openings 22 are connected to the inlet 40 and thus permit the incident flow of the tempered medium into the module 28 and through the cavity 25 with the component 30.

In the lower surface it can be seen in FIG. 5A that an outlet opening 24 is present, which permits the discharge of the tempered medium from the module 29 and the cavity 25. This outlet opening 24 is connected to the outlet 45 (FIGS. 3A and 3B) in the apparatus 10 in the position 15. The feeding of the tempered medium from the inlet 40 through the inlet opening 22 into the module 28 and the discharge of the tempered medium through the outlet opening 24 from the module 28 to the outlet 45 thus permit a flow of the tempered medium incident on the component 30 in the module 28.

Within the module 28, guiding channels can also be attached such that the component 30 is subjected to an incident flow of the tempered medium with defined flow directions. Thereby a good and quick thermal coupling of the component 30 is achieved.

The module 28 with the cavity 25 is adapted individually and in accurately fitting manner for the components 30. This ensures that no mechanical stresses are generated in the component 30.

From FIGS. 5A, 5B and 6 it can be recognized that the body 29 of the sample holder 20 is composed of two partial components 20u and 20o, which are brought into mutual contact in order to hold the component 30 in the cavity 25. Of course, also other methods are possible for firmly holding the component 30. The two partial components 20o and 20u each have a recess which form the cavity 25 together. It is also possible that only one of the partial components 20u, 20o has the recess for the cavity 25.

FIGS. 4, 5A, 5B and 6 show the module 28 and the cavity 25 with space for two components 30 in each case. The sample holder 20 can be constructed such that the sample holder 20 could receive several components 30, and the number of components is thus not limiting for the invention.

FIG. 5B shows the sample holder 20 with several connecting elements 26 which are constructed as spring contact pins in one aspect and which permit the electrical contact with the component 30. The connecting elements 26 conduct signals and power between the component 30 and a control and measuring device (not shown) via conductor paths (not shown) in the sample holder 30. The component 30 can be checked thereby. The control device can vary the strength of the magnetic field in the apparatus 10 and can also change the properties (temperature, humidity) of the tempered medium and thereby the environmental parameters of the component 30. Thus, a multiplicity of tests can be carried out in different environments.

In the further aspect with a lead frame, the components 20 are contacted, for example, via a pin card or via spring contact pins (also termed pogo pins).

The complete apparatus 10 is accommodated in a frame having movable parts, for example pneumatic cylinders, in order to push the sample holder 20 into and out of the apparatus and in order to keep the two parts of the sample holder 20 together.

Figure 8:
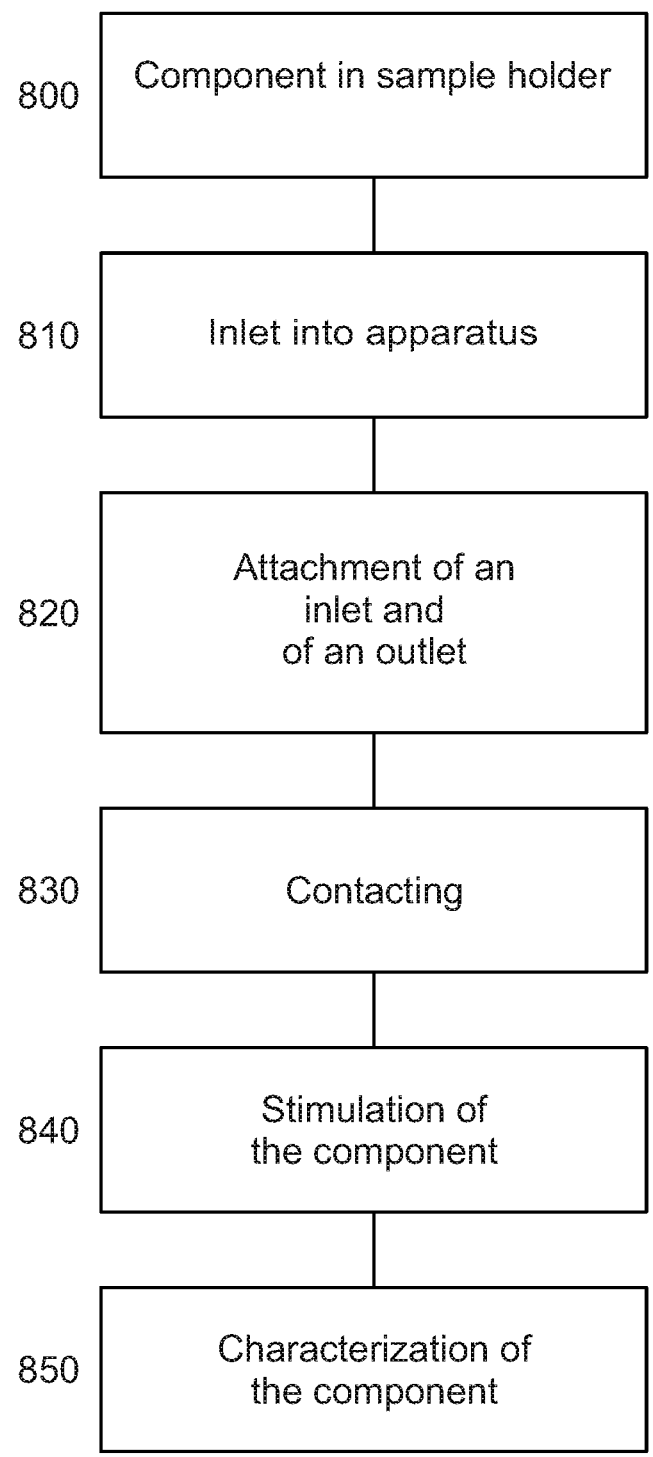
FIG. 8 shows a sequence of the method.

The sequence of the method for checking and calibrating the component 30 is explained briefly in FIG. 8. In a first step 800 the component 30 is incorporated and held in the sample holder 20. It should be noted here that the firm holding of the component 30 in the sample holder 20 should not cause any mechanical stresses to the component 30.

The sample holder 20 with the component 30 is introduced in the apparatus 10 in step 810, and in step 820 the sample holder 20 is positioned in the position 15 such that the inlet openings 22 of the sample holder 20 are connected with the inlet 40 of the apparatus. Likewise, the outlet opening 24 of the sample holder 20 is connected to the outlet 45 of the apparatus. The component 30 is electrically contacted in step 830, and in step 840 the component 30 is stimulated (magnetically/thermally/electrically), for the component 30 to be checked in step 850. The various environmental parameters (temperature, humidity, field strength) can be changed in the step.

REFERENCE NUMBERS

10 apparatus
15 common intersection of the coil axes
17 holder opening
20 sample holder
20o upper part
20u lower part
21 handle
22 inlet opening
24 outlet opening
25 cavity
26 connecting elements
28 module
29 body
30 component
40 inlet
45 outlet
60a, 60b, 60c pairs of coils

What is claimed is:

1. An apparatus for checking a component, comprising:
a sample holder with a module for receiving at least one component;
at least one magnetic field generator for generating a magnetic field around the module;
an inlet for feeding a tempered medium into the module; and
an outlet for discharging the tempered medium from the module, wherein the sample holder has at least one inlet opening for guiding on the tempered medium from the inlet into the module and at least one outlet opening of the tempered medium from the module to the outlet and wherein the at least one component is arranged between the inlet opening and the outlet opening, and wherein the inlet and the outlet are arranged such that the sample holder can be positioned between the inlet and the outlet.

2. The apparatus according to claim 1, wherein the sample holder comprises two parts and a cavity in the module is formed by mutually opposite recesses in both of the two parts or by a recess in one of the two parts.

3. The apparatus according to claim 1, further comprising a movable element for pressing together the two parts of the sample holder.

4. The apparatus according to claim 1, wherein the magnetic field generator comprises a plurality of coils.

5. The apparatus according to claim 4, wherein pairs of the plurality of coils are arranged orthogonally to each other.

6. The apparatus according to claim 1, wherein the magnetic field generator is constructed as a type of Helmholtz coil system and the generated magnetic field is substantially homogeneous.

7. The apparatus according to claim 4, wherein the magnetic field generator comprises a plurality of pairs of coils about the module.

8. The apparatus according to claim 4, wherein the at least one component is arranged substantially at the common intersection of the axes of the plurality of the coils.

9. The apparatus according to claim 1, wherein the sample holder has several connecting elements for contacting the component.

10. The apparatus according to claim 9, further comprising a plurality of movable contact pins for contacting the sample holder.

11. The apparatus according to claim 1, wherein the sample holder has guiding channels which conduct the tempered medium about the component.

12. The apparatus according to claim 1, wherein the at least one component has contact wires around which the tempered medium flows.

13. The apparatus according to claim 1, further comprising a control device for controlling the temperature of the tempered medium.

14. A method for checking a component in an apparatus, comprising:
introducing a sample holder with a component mounted in a cavity in a magnetic field;
attaching an inlet of the apparatus to an inlet opening in the sample holder;
attaching an outlet to an outlet opening of the apparatus in the sample holder such that the component is arranged between the inlet opening and the outlet opening, wherein the inlet and the outlet are arranged such that the sample holder can be positioned between the inlet and the outlet; and
stimulating the components in the cavity.

15. The method according to claim 14, comprising changing the environmental parameters.

16. The method according to claim 14, further comprising contacting the component and carrying out the checking.

17. The method according to claim 14, further comprising guiding the sample holder through the apparatus in a continuous process.

18. A sample holder comprising,
an upper part and an inlet opening; and
a lower part and an outlet opening;
wherein an upper recess and a lower recess upon joining the upper part with the lower part form a cavity for receiving a component; and
wherein the component is arranged in the cavity such that a tempered medium flows through the cavity around the component, wherein at least one of the upper part has a recess or the lower part has a recess, and the cavity is formed by at least one of the recesses.

19. The sample holder according to claim 18, wherein the sample holder has guiding channels for directing the tempered medium around the component.

20. The sample holder according to claim 18, further comprising connecting elements for electrically contacting the component.

* * * * *